(12) United States Patent
Steele et al.

(10) Patent No.: US 11,874,310 B2
(45) Date of Patent: Jan. 16, 2024

(54) MOTOR IDENTIFICATION BY FILTER DETERMINATION

(71) Applicant: Haier US Appliance Solutions, Inc., Wilmington, DE (US)

(72) Inventors: Victoria Steele, Louisville, KY (US); Steven Keith Root, Louisville, KY (US); Mark Thomas Fryman, Louisville, KY (US)

(73) Assignee: Haier US Appliance Solutions, Inc., Wilmington, DE (US)

( * ) Notice: Subject to any disclaimer, the term of this patent is extended or adjusted under 35 U.S.C. 154(b) by 0 days.

(21) Appl. No.: 17/743,825

(22) Filed: May 13, 2022

(65) Prior Publication Data

US 2023/0366916 A1    Nov. 16, 2023

(51) Int. Cl.
*G01R 27/02* (2006.01)
*H02K 11/00* (2016.01)
(Continued)

(52) U.S. Cl.
CPC ......... *G01R 27/02* (2013.01); *H02K 11/0094* (2013.01); *H02K 11/20* (2016.01); *H03H 7/06* (2013.01)

(58) Field of Classification Search
CPC .... G05B 11/28; G01R 31/2825; G01R 31/50; G01R 31/2827; G01R 31/52; G01R 27/2611; G01R 19/25; G01R 23/173; G01R 29/0871; G01R 31/00; G01R 31/1227; G01R 31/1272; G01R 33/0354; G01R 27/02; H02P 21/0017; H02P 21/13; H02P 21/18; H02P 21/22; H02P 27/12; H02P 6/182; H02P 29/0243; H02P 29/027;
(Continued)

(56) References Cited

U.S. PATENT DOCUMENTS 5,006,778 A * 4/1991 Bashark ............. G01R 31/2825
                                                                318/431
6,648,981 B2    11/2003 McIntyre et al.
(Continued)

FOREIGN PATENT DOCUMENTS

CN    103051261 A    4/2013
CN    202978797 U    6/2013
(Continued)

*Primary Examiner* — Vinh P Nguyen
(74) *Attorney, Agent, or Firm* — Dority & Manning, P.A.

(57) ABSTRACT

Systems and methods for identifying a motor coupled to an electrical appliance are disclosed herein. The electrical appliance can include a motor assembly comprising at least one electric motor and a filter network including an electrical resistance component and an electrical capacitance component. The electrical appliance can also include a controller electrically coupled to the motor assembly and the filter network, the controller comprising one or more processors and a memory comprising instructions for performing a process. The process can include providing an input signal to the filter network and receiving an output signal from the filter network, the output signal being filtered by the filter network. The process can also include identifying a filter characteristic of the filter network based on the output signal and identifying a type of the electric motor based on the identified filter characteristic.

20 Claims, 10 Drawing Sheets

(51) Int. Cl.
*H02K 11/20* (2016.01)
*H03H 7/06* (2006.01)

(58) Field of Classification Search
CPC .......... H02P 29/028; H02P 6/08; H02P 25/04;
H02P 21/12; H02P 21/141; H02P 21/20;
H02P 21/24; H02P 2207/05; H02P 23/12;
H02P 6/10; H02P 6/18; H02P 6/183;
A47L 9/2831; A47L 9/2857; A47L
9/2805; G01D 21/02; H02K 11/20; H02K
11/0094; H03H 7/06
See application file for complete search history.

(56) References Cited

U.S. PATENT DOCUMENTS

| | | | |
|---|---|---|---|
| 7,557,528 B2 | 7/2009 | Kumar et al. | |
| 8,947,034 B2 | 2/2015 | Chretien et al. | |
| 9,221,480 B2 * | 12/2015 | Daum | B61L 15/0081 |
| 9,281,767 B2 * | 3/2016 | Je | H02P 29/0241 |
| 9,932,701 B2 | 4/2018 | Bevilaqua et al. | |
| 9,970,426 B2 | 5/2018 | Kim et al. | |
| 10,348,223 B1 * | 7/2019 | Khosravi | G01R 31/343 |
| 10,439,522 B2 | 10/2019 | Takemoto | |
| 10,705,145 B2 * | 7/2020 | Chae | G01R 31/343 |
| 2020/0177115 A1 | 6/2020 | Takemoto et al. | |
| 2020/0295695 A1 | 9/2020 | Takemoto | |
| 2020/0350839 A1 | 11/2020 | Takemoto | |
| 2021/0006186 A1 | 1/2021 | Takemoto | |

FOREIGN PATENT DOCUMENTS

| | | |
|---|---|---|
| CN | 106100470 A | 11/2016 |
| CN | 106870343 A | 6/2017 |
| CN | 113691188 A | 11/2021 |
| WO | WO2019181470 A1 | 9/2019 |
| WO | WO2019181472 A1 | 9/2019 |
| WO | WO2020239326 A1 | 12/2020 |

* cited by examiner

500

| 10KΩ/5nF (Fc = 3.1KHz) | | | |
|---|---|---|---|
| PWM Frequency (Hz) | Max Voltage (V) | Min Voltage (V) (unused) | Gain (dB) |
| 1000 | 3.3 | 0 | 0 |
| 1500 | 3.3 | 0 | 0 |
| 2000 | 3.3 | 0.06 | 0 |
| 2500 | 3.25 | 0.10 | -0.13 |
| 3000 | 3.18 | 0.18 | -0.827 |
| 3500 | 3.14 | 0.3 | -1.303 |

FIG. 5

| F | R1 | Vmax | Vmin |
|---|---|---|---|
| 8KHz | 10KΩ | 2.64V | 0.96V |
| | 15KΩ | 2.38V | 1.20V |
| | 20KΩ | 2.26V | 1.33V |
| 6KHz | 10KΩ | 2.83V | 0.77V |
| | 15KΩ | 2.59V | 1.07V |
| | 20KΩ | 2.425V | 1.28V |

FIG. 6

EXAMPLE PEAK DETECTION CIRCUIT FOR
10KΩ AND 5nF CONFIGURATION

MOTOR IDENTIFICATION BY FILTER DETERMINATION

FIELD OF THE INVENTION

The present subject matter relates generally to methods and systems for identifying types of motors used in appliances.

BACKGROUND OF THE INVENTION

Appliances frequently include electric motor assemblies for operation of the appliance, such as a pump assembly for a dishwasher or a motor assembly for a dryer. Different appliances can have different types and models of motors, and motors on the appliances can be replaced with new motors from different manufacturers. The replacement motors can require different operation parameters than the original motor in the motor assembly.

Notably, however, developing control software that can generate operation parameters for multiple different motors can be difficult. The problem can be exacerbated by safety requirements for the appliance, such as abnormal failure condition protections. For example, a motor with copper winding must be operated differently than a motor with aluminum winding, as the heat rise characteristics of these motors are very different from one another. If an appliance has a motor with copper winding replaced with a motor with aluminum winding, the appliance must be able to operate the replacement motor differently than the replaced motor.

Accordingly, an appliance having a system for identifying a motor currently in use at the appliance would be particularly beneficial.

BRIEF DESCRIPTION OF THE INVENTION

Aspects and advantages of the invention will be set forth in part in the following description, or may be obvious from the description, or may be learned through practice of the invention.

In one exemplary embodiment, an electrical appliance can be provided. The electrical appliance can include a motor assembly comprising at least one electric motor and a filter network, the filter network comprising an electrical resistance component and an electrical capacitance component, wherein at least one of the electrical resistance component or the electrical capacitance component is located within the motor assembly. The electrical appliance can also include a controller electrically coupled to the motor assembly and the filter network, the controller comprising one or more processors and a memory comprising instructions. When executed by the one or more processors, the one or more instructions cause the one or more processors to perform a process. The process can include providing an input signal to the filter network and receiving an output signal from the filter network, the output signal being filtered by the filter network. The process can also include identifying a filter characteristic of the filter network based on the output signal and identifying a type of the electric motor based on the identified filter characteristic.

In another exemplary embodiment, A method for identifying a type of electric motor coupled to an electrical appliance can be provided. The method can include providing, by a controller, an input signal to a filter network of the electrical appliance and receiving, by the controller, an output signal from the filter network, the output signal being filtered by the filter network. The method can also include identifying, by the controller, a filter characteristic of the filter network based on the output signal; and identifying, by the controller, a type of the electric motor based on the identified filter characteristic.

In a further exemplary embodiment, a non-transitory, computer-readable medium can be provided. The non-transitory, computer-readable medium can include instructions that, when executed by one or more processors, cause the one or more processes to perform a process. The process can include providing an input signal to a filter network of the electrical appliance and receiving an output signal from the filter network, the output signal being filtered by the filter network. The process can also include identifying a filter characteristic of the filter network based on the output signal and identifying a type of the electric motor based on the identified filter characteristic.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures.

FIG. 5 provides a table illustrating a voltage gain between an input voltage and an output voltage for a filter network according to exemplary embodiments of the present disclosure.

FIG. 6 provides a table illustrating a comparison between input and output voltages at different fixed input frequencies for a filter network according to exemplary embodiments of the present disclosure.

Figure 1:
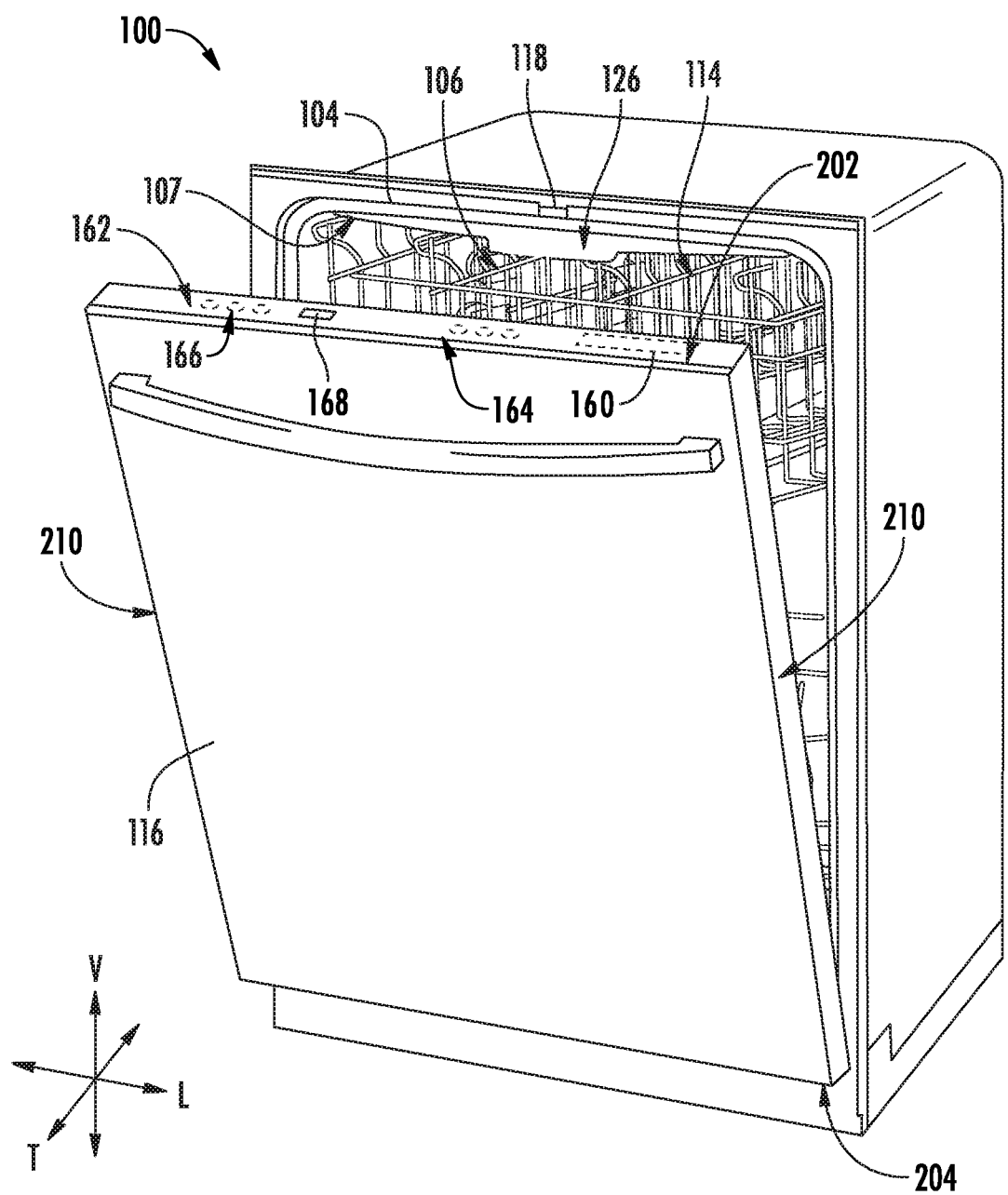
FIG. 1 provides a perspective view of a dishwasher appliance, including a dishwasher door according to exemplary embodiments of the present disclosure.

Repeat use of reference characters in the present specification and drawings is intended to represent the same or analogous features or elements of the present invention.

DETAILED DESCRIPTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

As used herein, the terms "first," "second," and "third" may be used interchangeably to distinguish one component from another and are not intended to signify location or importance of the individual components. In addition, the term "or" is generally intended to be inclusive (i.e., "A or B" is intended to mean "A or B or both"). Furthermore, as used herein, terms of approximation, such as "approximately," "substantially," or "about," refer to being within a ten percent margin of error.

Figure 2:
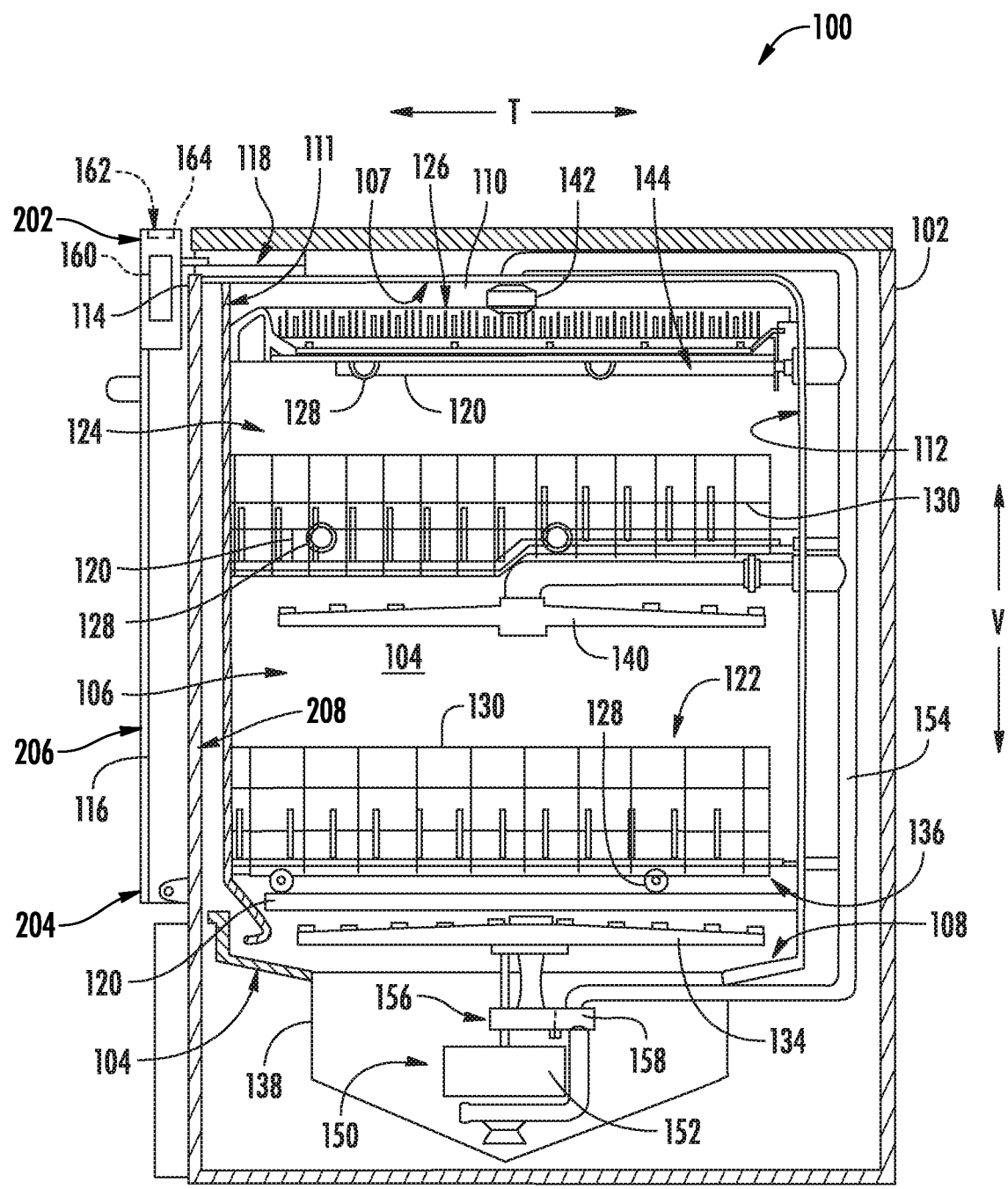
FIG. 2 provides a cross-sectional side view of the exemplary dishwashing appliance of FIG. 1.

FIGS. 1 and 2 depict an exemplary domestic dishwasher or dishwashing appliance 100 that may be configured in accordance with aspects of the present disclosure. For the particular embodiment of FIGS. 1 and 2, the dishwasher 100 includes a cabinet 102 having a tub 104 therein that defines a wash chamber 106. As shown, tub 104 extends between a top 107 and a bottom 108 along a vertical direction V, between a pair of side walls 110 along a lateral direction L, and between a front side 111 and a rear side 112 along a transverse direction T. Each of the vertical direction V, lateral direction L, and transverse direction T are mutually orthogonal to one another.

The tub 104 includes a front opening 114 and a door 116 hinged at its bottom for movement between a normally closed vertical position (shown in FIG. 2), wherein the wash chamber 106 is sealed shut for washing operation, and a horizontal open position for loading and unloading of articles from the dishwasher 100. According to exemplary embodiments, dishwasher 100 further includes a door closure mechanism or assembly 118 that is used to lock and unlock door 116 for accessing and sealing wash chamber 106.

As illustrated in FIG. 2, tub side walls 110 may accommodate a plurality of rack assemblies. More specifically, guide rails 120 may be mounted to side walls 110 for supporting a lower rack assembly 122, a middle rack assembly 124, and an upper rack assembly 126. As illustrated, upper rack assembly 126 is positioned at a top portion of wash chamber 106 above middle rack assembly 124, which is positioned above lower rack assembly 122 along the vertical direction V. Each rack assembly 122, 124, 126 is adapted for movement between an extended loading position (not shown) in which the rack is substantially positioned outside the wash chamber 106, and a retracted position (shown in FIGS. 1 and 2) in which the rack is located inside the wash chamber 106. This is facilitated, for example, by rollers 128 mounted onto rack assemblies 122, 124, 126, respectively. Although guide rails 120 and rollers 128 are illustrated herein as facilitating movement of the respective rack assemblies 122, 124, 126, it should be appreciated that any suitable sliding mechanism or member may be used according to alternative embodiments.

Some or all of the rack assemblies 122, 124, 126 are fabricated into lattice structures including a plurality of wires or elongated members 130 (for clarity of illustration, not all elongated members making up rack assemblies 122, 124, 126 are shown in FIG. 2). In this regard, rack assemblies 122, 124, 126 are generally configured for supporting articles within wash chamber 106 while allowing a flow of wash fluid to reach and impinge on those articles (e.g., during a cleaning or rinsing cycle). According to another exemplary embodiment, a silverware basket (not shown) may be removably attached to a rack assembly (e.g., lower rack assembly 122) for placement of silverware, utensils, and the like, that are otherwise too small to be accommodated by rack 122.

Dishwasher 100 further includes a plurality of spray assemblies for urging a flow of water or wash fluid onto the articles placed within wash chamber 106. More specifically, as illustrated in FIG. 2, dishwasher 100 includes a lower spray arm assembly 134 disposed in a lower region 136 of wash chamber 106 and above a sump 138 so as to rotate in relatively close proximity to lower rack assembly 122. Similarly, a mid-level spray arm assembly 140 is located in an upper region of wash chamber 106 and may be located below and in close proximity to middle rack assembly 124. In this regard, mid-level spray arm assembly 140 may generally be configured for urging a flow of wash fluid up through middle rack assembly 124 and upper rack assembly 126. Additionally, an upper spray assembly 142 may be located above upper rack assembly 126 along the vertical direction V. In this manner, upper spray assembly 142 may be configured for urging or cascading a flow of wash fluid downward over rack assemblies 122, 124, and 126. As further illustrated in FIG. 2, upper rack assembly 126 may further define an integral spray manifold 144, which is generally configured for urging a flow of wash fluid substantially upward along the vertical direction V through upper rack assembly 126.

The various spray assemblies and manifolds described herein may be part of a fluid distribution system or fluid circulation assembly 150 for circulating water and wash fluid in the tub 104. More specifically, fluid circulation assembly 150 includes a pump 152 for circulating water or wash fluid (e.g., detergent, water, or rinse aid) in the tub 104. Pump 152 may be located within sump 138 or within a machinery compartment located below sump 138 of tub 104, as generally recognized in the art. Fluid circulation assembly 150 may include one or more fluid conduits or circulation piping for directing water or wash fluid from pump 152 to the various spray assemblies and manifolds. For example, as illustrated in FIG. 2, a primary supply conduit 154 may extend from pump 152, along rear 112 of tub 104 along the vertical direction V to supply wash fluid throughout wash chamber 106.

As illustrated, primary supply conduit 154 is used to supply wash fluid to one or more spray assemblies (e.g., to mid-level spray arm assembly 140 and upper spray assembly 142). However, it should be appreciated that according to alternative embodiments, any other suitable plumbing configuration may be used to supply wash fluid throughout the various spray manifolds and assemblies described herein. For example, according to another exemplary embodiment, primary supply conduit 154 could be used to provide wash fluid to mid-level spray arm assembly 140 and a dedicated secondary supply conduit (not shown) could be utilized to provide wash fluid to upper spray assembly 142. Other plumbing configurations may be used for providing wash fluid to the various spray devices and manifolds at any location within dishwasher appliance 100.

Each spray arm assembly 134, 140, 142, integral spray manifold 144, or other spray device may include an arrangement of discharge ports or orifices for directing wash fluid received from pump 152 onto dishes or other articles located in wash chamber 106. The arrangement of the discharge ports, also referred to as jets, apertures, or orifices, may provide a rotational force by virtue of wash fluid flowing through the discharge ports. Alternatively, spray arm assemblies 134, 140, 142 may be motor-driven, or may operate using any other suitable drive mechanism. Spray manifolds and assemblies may also be stationary. The resultant movement of the spray arm assemblies 134, 140, 142 and the spray from fixed manifolds provides coverage of dishes and other dishwasher contents with a washing spray. Other configurations of spray assemblies may be used as well. For example, dishwasher 100 may have additional spray assemblies for cleaning silverware, for scouring casserole dishes, for spraying pots and pans, for cleaning bottles, etc. One skilled in the art will appreciate that the embodiments discussed herein are used for the purpose of explanation only and are not limitations of the present subject matter.

In operation, pump 152 draws wash fluid in from sump 138 and pumps it to a diverter assembly 156 (e.g., which may be positioned within sump 138 of dishwasher appliance 100). Pump 152 can be a component of a pump assembly, which can include pump 152 and a motor, such as an electric motor, that powers pump 152.

Diverter assembly 156 may include a diverter disk (not shown) disposed within a diverter chamber 158 for selectively distributing the wash fluid to the spray arm assemblies 134, 140, 142 or other spray manifolds or devices. For example, the diverter disk may have a plurality of apertures that are configured to align with one or more outlet ports (not shown) at the top of diverter chamber 158. In this manner, the diverter disk may be selectively rotated to provide wash fluid to the desired spray device.

According to an exemplary embodiment, diverter assembly 156 is configured for selectively distributing the flow of wash fluid from pump 152 to various fluid supply conduits, only some of which are illustrated in FIG. 2 for clarity. More specifically, diverter assembly 156 may include four outlet ports (not shown) for supplying wash fluid to a first conduit for rotating lower spray arm assembly 134 in the clockwise direction, a second conduit for rotating lower spray arm assembly 134 in the counter-clockwise direction, a third conduit for spraying an auxiliary rack such as the silverware rack, and a fourth conduit for supply mid-level or upper spray assemblies 140, 142 (e.g., such as primary supply conduit 154).

The dishwasher 100 is further equipped with a controller 160 to regulate operation of the dishwasher 100. The controller 160 may include one or more memory devices and one or more microprocessors, such as general or special purpose microprocessors operable to execute programming instructions or micro-control code associated with a cleaning cycle. The memory may represent random access memory such as DRAM or read only memory such as ROM or FLASH. In one embodiment, the processor executes programming instructions stored in memory. The memory may be a separate component from the processor or may be included onboard within the processor. Alternatively, controller 160 may be constructed without using a microprocessor (e.g., using a combination of discrete analog or digital logic circuitry, such as switches, amplifiers, integrators, comparators, flip-flops, AND gates, and the like) to perform control functionality instead of relying upon software.

The controller 160 may be positioned in a variety of locations throughout dishwasher 100. In the illustrated embodiment, the controller 160 may be located within a control panel area 162 of door 116, as shown in FIGS. 1 and 2. In such an embodiment, input/output ("I/O") signals may be routed between the control system and various operational components of dishwasher 100 along wiring harnesses that may be routed through the bottom of door 116. Typically, the controller 160 includes a user interface panel 164 through which a user may select various operational features and modes and monitor progress of the dishwasher 100. In one embodiment, the user interface 164 may represent a general purpose I/O ("GPIO") device or functional block. In certain embodiments, the user interface 164 includes input components 166, such as one or more of a variety of electrical, mechanical, or electro-mechanical input devices including rotary dials, push buttons, and touch pads. The user interface 164 may further include one or more display components 168, such as a digital display device or one or more indicator light assemblies designed to provide operational feedback to a user. The user interface 164 may be in communication with the controller 160 via one or more signal lines or shared communication busses.

It should be appreciated that the present subject matter is not limited to any particular style, model, or configuration of dishwasher 100. The exemplary embodiment depicted in FIGS. 1 and 2 is for illustrative purposes only. For example, different locations may be provided for user interface 164, different configurations may be provided for rack assemblies 122, 124, 126, different spray arm assemblies 134, 140, 142 and spray manifold configurations may be used, and other differences may be applied while remaining within the scope of the present subject matter. Moreover, aspects of the present subject matter may be applied to other appliances that include motors as well, such as refrigerators, ovens, microwaves, etc. More generally, aspects of the present subject matter may be applied to any assembly for appliances that include a motor for operating components of the appliance, such as a washing machine having one or more motors for a washing tub, a dryer having one or more motors for a spin dryer tub, an air conditioning unit having one or more motors for fans of the air conditioning unit, and other appliances having motors.

Figure 3A:
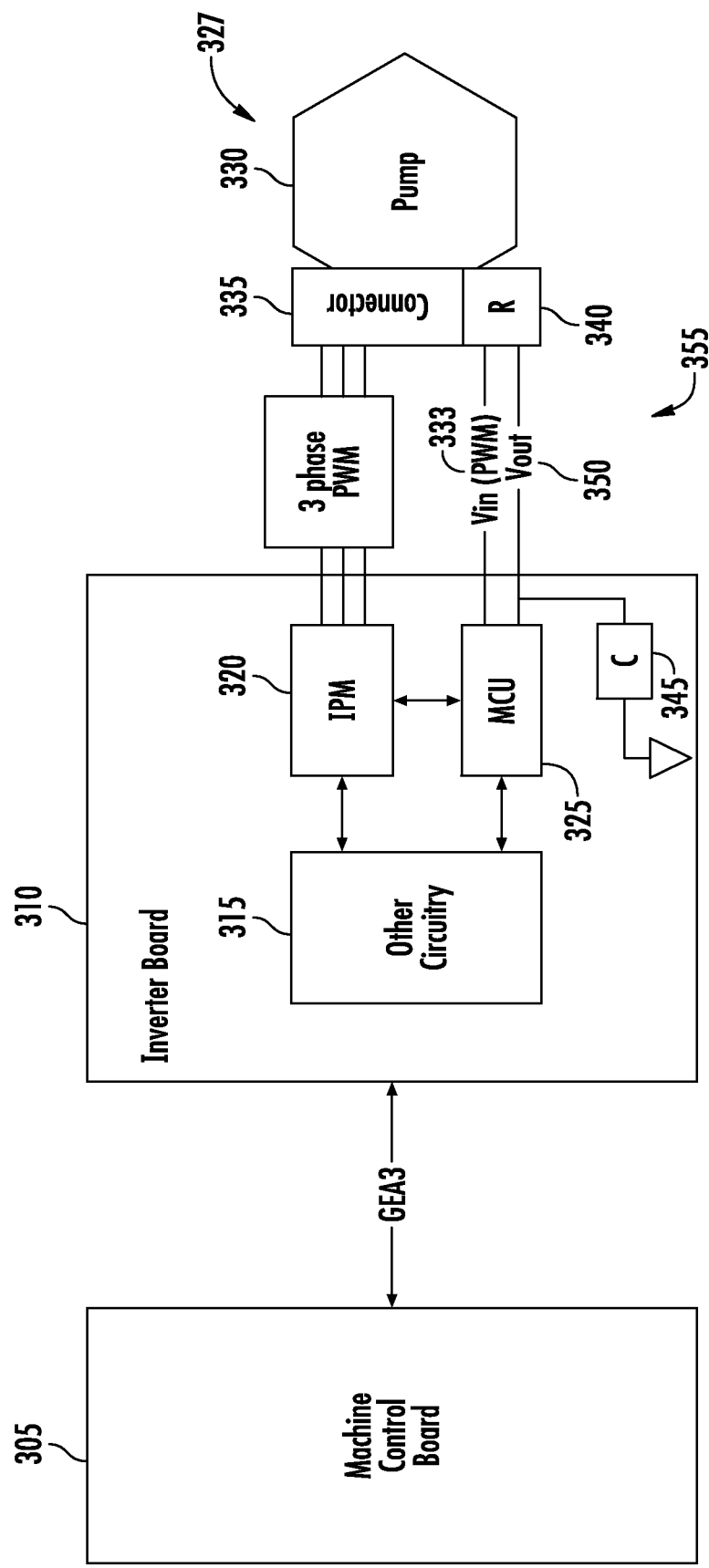
FIG. 3A provides a block diagram illustrating a circuit diagram for an electrical appliance according to exemplary embodiments of the present disclosure.

FIG. 3A provides a block diagram illustrating a circuit diagram for an electrical appliance according to exemplary embodiments of the present disclosure. In some embodiments, the electrical appliance can be a dishwasher, such as dishwasher 100 described above with regards to FIG. 1 and FIG. 2.

The electrical appliance can include a machine controller 305. In some embodiments, machine controller 305 can be a controller similar to controller 160 and is generally designed to control total operation of the electrical appliance. The controller 305 can be electrically coupled to an inverter board 310. Inverter board 310 can include electrical components (e.g., other components 315) for converting direct current ("DC") power to alternating current ("AC") power. For example, inverter board 310 can receive DC power from a power source for the electrical appliance, such as a 120V input voltage, and convert the DC power to an AC waveform to power a motor of the electrical appliance.

Inverter board 310 can include an inverter pulse modulator 320 and a motor control unit 325. The inverter pulse modulator 320 can generate a pulse-width modulated waveform for controlling a motor, such as motor 330 of a motor assembly 327 of the electrical appliance. For example, inverter pulse modulator 320 can generate a pulse width modulated waveform ("PWM") that, when received by motor 330, causes motor 330 to operate with operation parameters defined by the received PWM.

Motor control unit 325 can be a controller that includes one or more processors 326a and/or one or more memories

326*b* that contain instructions for execution by the one or more processors. Motor control unit 325 can generate an input signal 333 for the motor assembly 327, provide the input signal 333 to the motor assembly 327, and receive an output signal 350 from the motor assembly 327. Based on the output signal, the motor control unit 325 can determine a unique type of motor 330, a manufacturer of motor 330, operational parameters of motor 330, and other information about motor 330 as described below. In some embodiments, motor control unit 325 can output a series of input signals 333 that have different signal characteristics, such as various PWM signals with different duty cycles, peak voltages, and the like. In some embodiments, motor control unit 325 can output a continuous signal that "sweeps" frequencies within a range of frequencies, such as providing a continuous signal at a set voltage while constantly increasing the frequency of the continuous signal.

The motor assembly 327 can include motor 330, connector 335, electrical resistance element 340, and electrical capacitance element 345. Motor 330 can be an electric motor and can be a component of a motor assembly 327 of the electrical appliance. In some embodiments, motor 330 can be a brushed or brushless motor, a single-phase, two-phase, or three-phase motor, or another type of motor. Motor 330 can receive DC power or AC power to operate. For example, motor 330 can receive a three-phase PWM from inverter pulse modulator 320 to operate via connector 335, which can include a connecting pin for each individual wire or electrical connection carrying a single phase of the three-phase PWM to motor 330. For example, if motor 330 operates using a three-phase PWM, connector 335 can include 3 pins, one for each connection carrying a single phase of the three-phase PWM to motor 330 from inverter pulse modulator 320.

Electrical resistance element 340 can be, in some embodiments, a resistor with a fixed electrical resistance value or another suitable electrically resistant component. In some embodiments, electrical resistance element 340 can be contained within connector 335 and can be connected to a pin to receive an input signal 333 from motor control unit 325 and can be connected to a pin to provide an output signal 350 back to motor control unit 325. In other embodiments, electrical resistance element 340 can be included as a component on inverter board 310 and can have one terminal electrically coupled to motor control unit 325 and the other terminal electrically coupled to connector 335.

Electrical capacitance component 345 can be, in some embodiments, a capacitor or capacitor network with a fixed capacitance value. In other embodiments electrical capacitance component 345 can be a circuit including capacitive elements, such as a peak detection circuit. As shown in FIG. 3A, the electrical capacitance element 345 can be a component of inverter board 310. However, the electrical capacitance element 345 can instead be a component of the motor assembly 327 in a similar manner to the electrical resistance element 340.

In general, the electrical resistance element 340 and the electrical capacitance element 345 form a filter network 355. The filter network 355 can be a low-pass filter, a high-pass filter, a band-pass filter, and the like. The filter network 355 can be a passive filter or an active filter. In order to minimize a number of pins for connector 335 and minimize the size of connector 335, it is advantageous to have only one of the electrical resistance element 340 and the electrical capacitance element 345 located within in the motor assembly 327, with the other of the two components being located on the inverter board 310. Therefore, the motor assembly 327 comprises at least one of the electrical resistance element 340 or the electrical capacitance element 345. However, both the electrical resistance element 340 and the electrical capacitance element 345 can be located within the motor assembly 327.

Figure 3B:
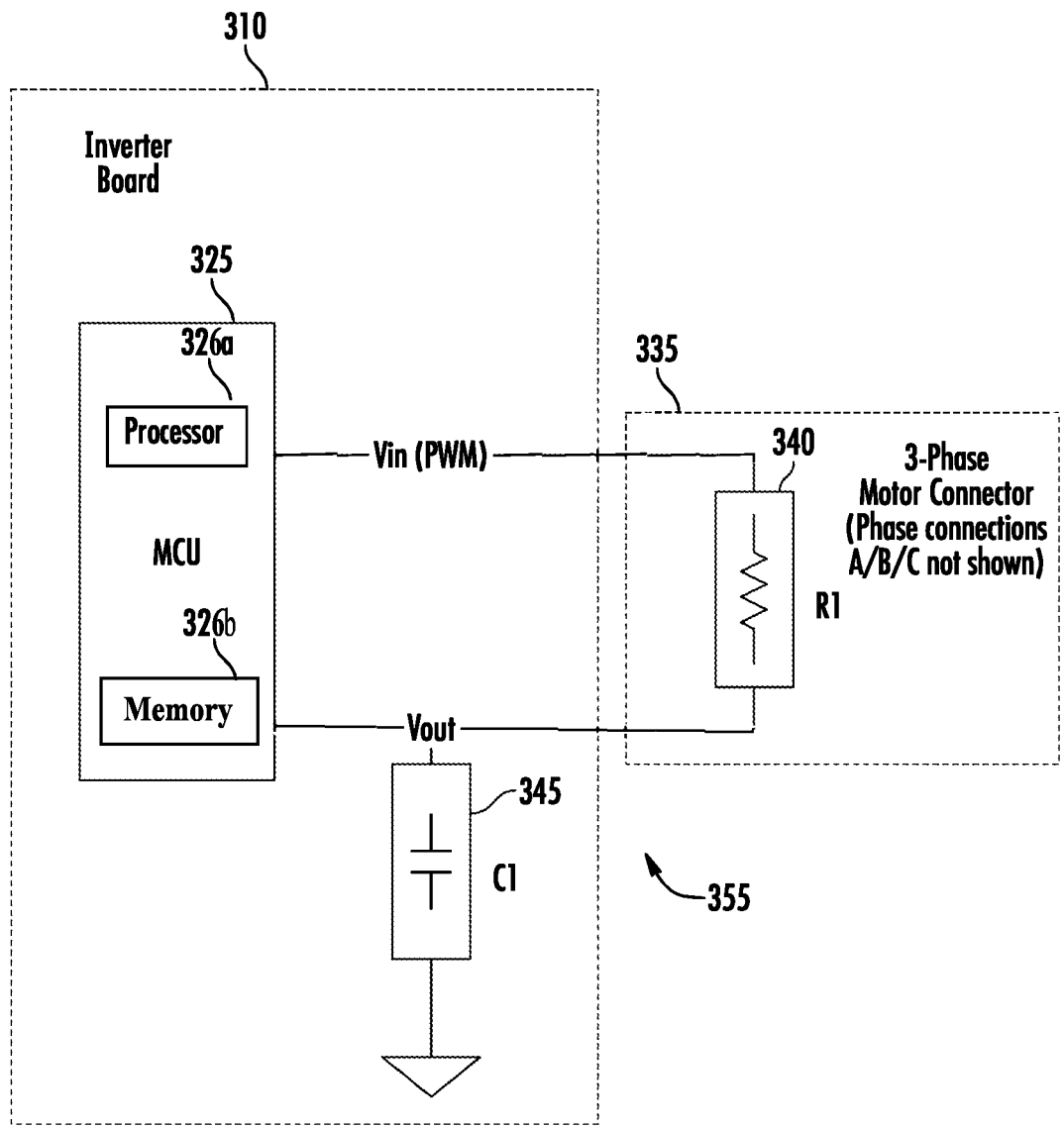
FIG. 3B provides a second block diagram illustrating a second circuit diagram for an electrical appliance according to exemplary embodiments of the present disclosure.

A simplified circuit diagram for the electrical appliance according to exemplary embodiments of the present disclosure is shown in FIG. 3B. In particular, FIG. 3B illustrates a simplified diagram for the filter network 355. Motor control unit 325 provides an input signal 333, such as a PWM input voltage, to a pin of connector 335 associated with the filter network 355. The input signal 333 travels through the filter network 355 (e.g., through electrical resistance component 340 and back out of a second pin of connector 335 and to electrical capacitance component 345) and the resulting output signal 350 is measured by motor control unit 325 to determine a filter characteristic of the filter network 355. As used in this application, a filter characteristic can be any measurable quantity of behavior of the filter network 355, such as output voltage, voltage gain between input and output, minimum and maximum output voltages, a cutoff frequency of the filter network 355, and other quantities.

Based on the filter characteristic, motor control unit 325 can identify characteristics of motor 330. For example, motor control unit 325 can generate a series of input signal 333 at various frequencies and then measure the series of received outputs from the filter network 355. In another example, motor control unit 325 can generate a continuous input signal at a fixed voltage while sweeping up or down frequencies while measuring the continuous output from the filter network 355 to determine the response of the filter network 355 to the continuous signal at different frequencies.

In a low-pass filter, the input signal 333 can be passed, or transmitted, through the filter network 355. If the frequency of the input signal 333 is below the cut-off frequency (defined by the resistance and capacitance of the elements of the filter network 355), the input signal 333 is allowed through. If the frequency of the input signal 333 is above the cut-off frequency, the input signal 333 is blocked, and the resulting output signal 350 has a much lower voltage, resulting in a low to negative gain value.

The reactance of the electrical capacitance element 345 varies inversely with the frequency of the input signal 333. The resistance of the electrical resistance element 340 remains constant. Therefore, at low frequencies, the reactance of the electrical capacitance element 345 will be very large compared to the resistive value of the electrical resistance element 340. This means that the potential voltage across the electrical capacitance element 345 will be much larger than the voltage drop across the electrical resistance element 340 when an input signal 333 with a low frequency is provided to the filter network 355. When the input signal 333 has a high frequency, the voltage drop across the electrical resistance element 340 will be much higher than the potential voltage across the electrical capacitance element 345.

Figure 4:
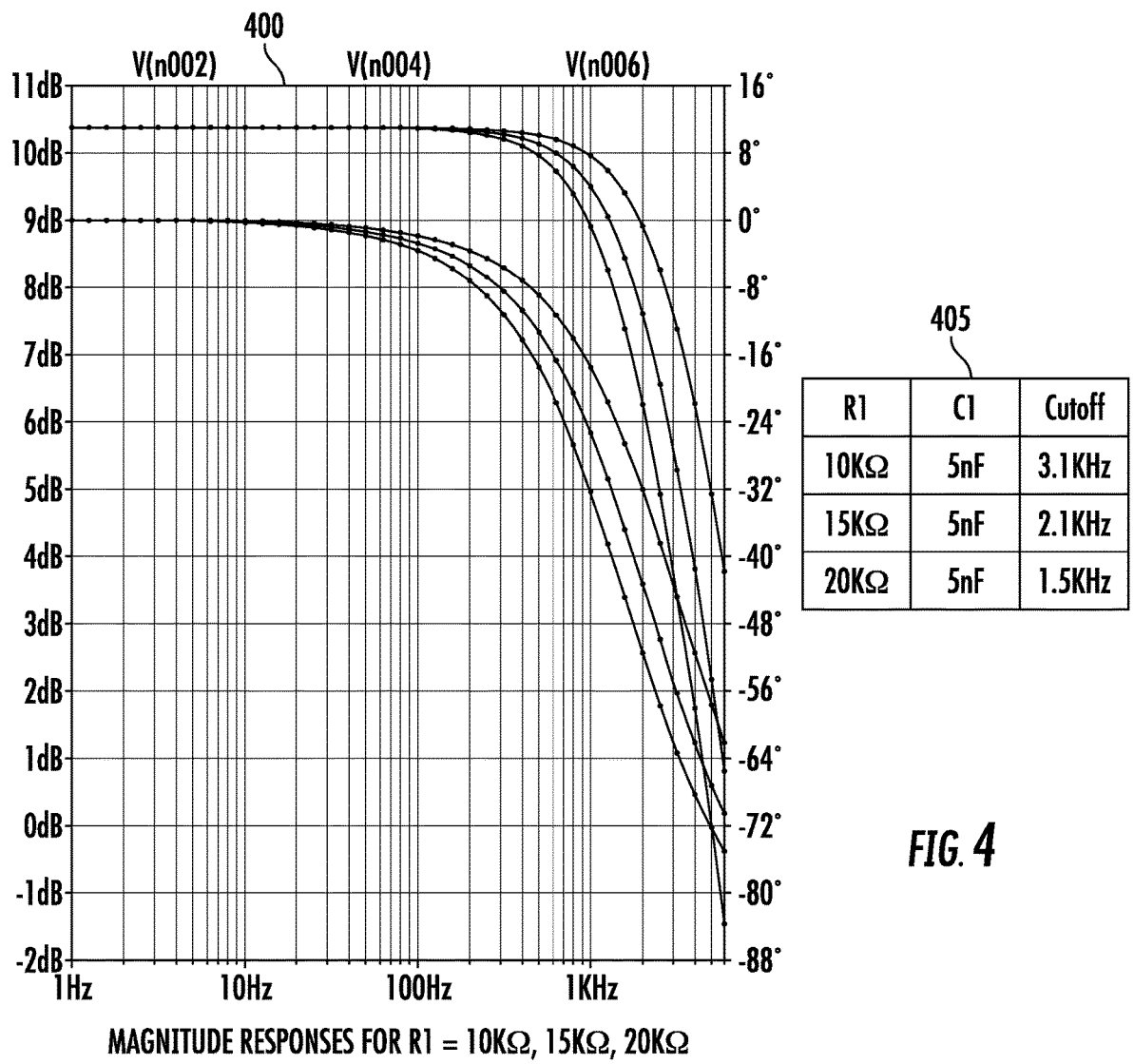
FIG. 4 provides a graph and table illustrating cutoff frequencies for different filter networks according to exemplary embodiments of the present disclosure.

FIG. 4 provides a graph 400 and table 405 illustrating cutoff frequencies for different filter networks 355 according to exemplary embodiments of the present disclosure. FIG. 4 illustrates how the resistance value of the electrical resistance component 340 can be varied and the effect the amount of resistance of the electrical resistance component 340 can have on the cutoff frequency of the filter network 355 when the capacitance of the electrical capacitance component 345.

For example, as the resistance of the electrical resistance element 340 increases, the cutoff frequency decreases.

Returning to FIG. 3B, the output signal 350 is measured in parallel to the electrical capacitance element 345. Therefore, when the potential voltage across the electrical capacitance element 345 is low (at high frequencies, such as frequencies above the cut-off frequency), the measured gain of the output signal 350 will be low.

The motor control unit 325 can generate a series of input signal 333, each input signal 333 having the same input voltage and a frequency larger than the proceeding input signal 333 (e.g., a first input signal 333 with a frequency of 1 kilohertz ("kHz"), a second input signal 333 with a frequency of 1.5 kHz, a third input signal 333 with a frequency of 2 kHz, and the like). In another example, motor control unit 325 can generate a continuous input signal at a fixed voltage while sweeping up or down frequencies while measuring the continuous output from the filter network 355 to determine the response of the filter network 355 to the continuous signal at different frequencies.

For example, FIG. 5 provides a table 500 illustrating a voltage gain between an input voltage and an output voltage for a filter network 355 according to exemplary embodiments of the present disclosure. Various input signal 333 can be provided to a filter network 355 that includes a 10 kiloohm resistance and a 5 nano-farad capacitance, which results in a 3.1 kHz cutoff frequency. Each input signal 333 can be provided at 3.3 volts, and the resulting output voltage can be measured (Max Voltage). As the frequency of the input signal 333 approach and then cross the 3.1 kHz cutoff frequency, the maximum measured output voltage begins to decrease, which results in a negative gain being measured.

Returning again to FIG. 3B, the motor control unit 325 can determine the gain from each input signal 333 of the series of input signal 333. Based on the determined gains of each input signal 333, the motor control unit 325 can determine when the cutoff frequency of the filter network 355 is being approached and crossed. Therefore, the motor control unit 325 can determine a cutoff frequency of the filter network 355. Based on the determined cutoff frequency of the filter network 355, the motor control unit 325 can identify the motor 330 as described below.

In other embodiments, motor control unit 325 can determine gains from the filter network 355 based on an input signal 333 with a fixed frequency and voltage by measuring the maximum output voltage of the output signal 350 and measuring the minimum output voltage of the output signal 350.

For example, FIG. 6 provides a table 600 illustrating a comparison between input and output voltages at different fixed input frequencies for a filter network 355 according to exemplary embodiments of the present disclosure. Instead of applying a series of input signal 333 with variable frequencies to identify a cutoff frequency, an input signal 333 with a fixed frequency is provided to the filter network 355, such as an input signal 333 with an 8 kHz frequency. The minimum and maximum voltage of the resulting output signal 350 can be controlled based on the electrical resistance of the electrical resistance element 340, assuming that the electrical capacitance of the electrical capacitance element 345 remains constant. Based on the measured minimum and maximum output voltages, the motor control unit 325 can identify a type of the motor 330 as described below.

Figure 7:
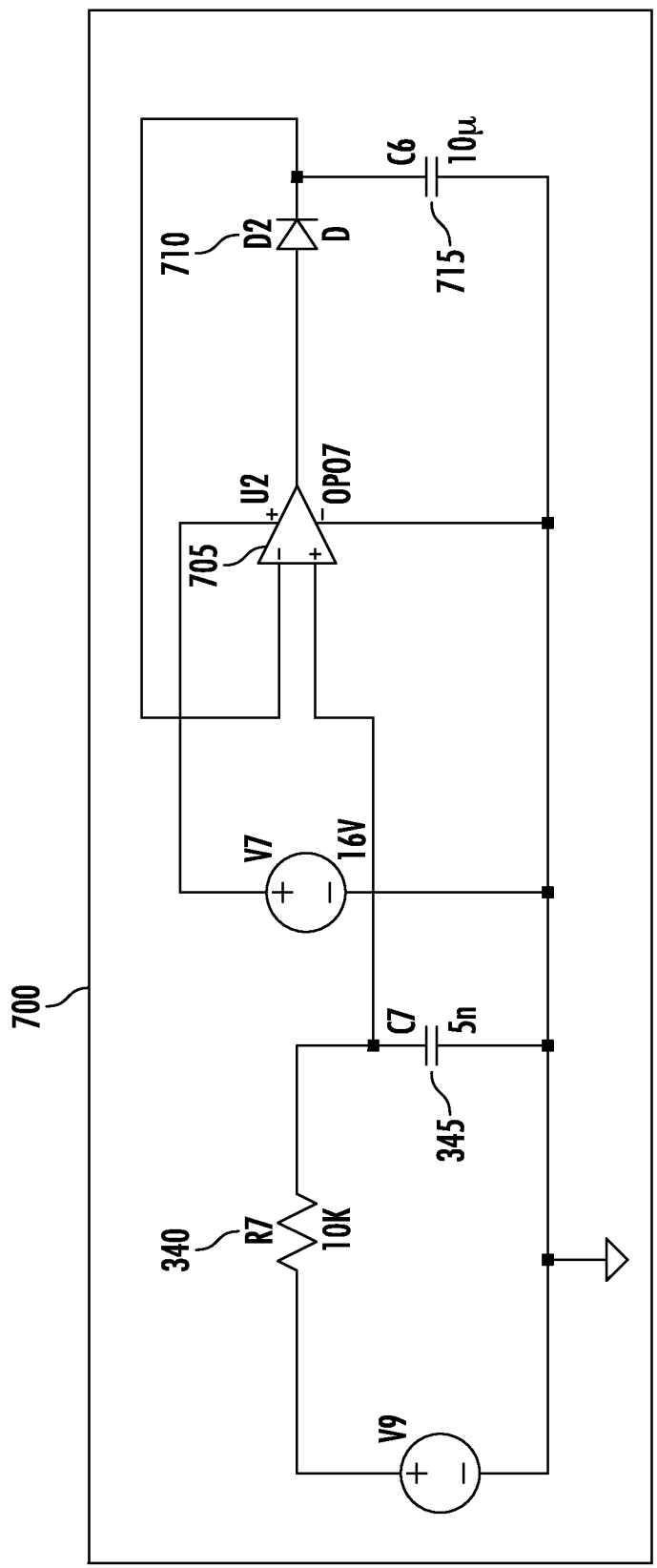
FIG. 7 provides a circuit schematic for a peak detection circuit according to exemplary embodiments of the present disclosure.

In some embodiments, motor control unit 325 may not have a sufficiently fast analog-to-digital converter ("ADC") to capture the minimum and maximum output voltages. In these embodiments, a peak detector circuit can be used to capture the minimum and maximum output voltages. An example circuit schematic for a peak detection circuit 700 according to exemplary embodiments of the present disclosure is shown in FIG. 7. Peak detector circuits can be used to determine a peak (or maximum) value of a signal, such as an output signal 350 from the filter network 355. Peak values, or maximum values, are tracked and, when a new highest voltage value is measured, that value is stored as the new peak value. The peak detection circuit 700 can include an operational amplifier 705, a diode 710, and a peak detection capacitor 715. The peak detection circuit 700 receives output signal 350 from the filter network 355. Peak detection capacitor 715 is charged to an initial voltage $V_c$. Diode 710 is forward biased when the output signal 350 has an output voltage greater than $V_c$, which allows the peak detection capacitor 715 to charge to the new, higher output voltage, setting the new $V_c$ to the new output voltage. When the output voltage reduces to less than the new $V_c$, the diode 710 becomes reverse-biased. Therefore, $V_c$ remains at the new value until a greater output voltage from the output signal 350 is detected. $V_c$ can then be measured and used to determine a maximum output voltage from output signal 350.

To detect minimum voltages, a second peak detection circuit similar to the peak detection circuit 700 can be used, with the only change being a reverse in the polarities of the diode 710, or forward biasing the diode 710 when the output voltage is less than $V_c$ and reverse biasing the diode 710 when the output voltage is greater than $V_c$. $V_c$ can then be measured and used to determine a minimum output voltage from output signal 350.

Figure 8:
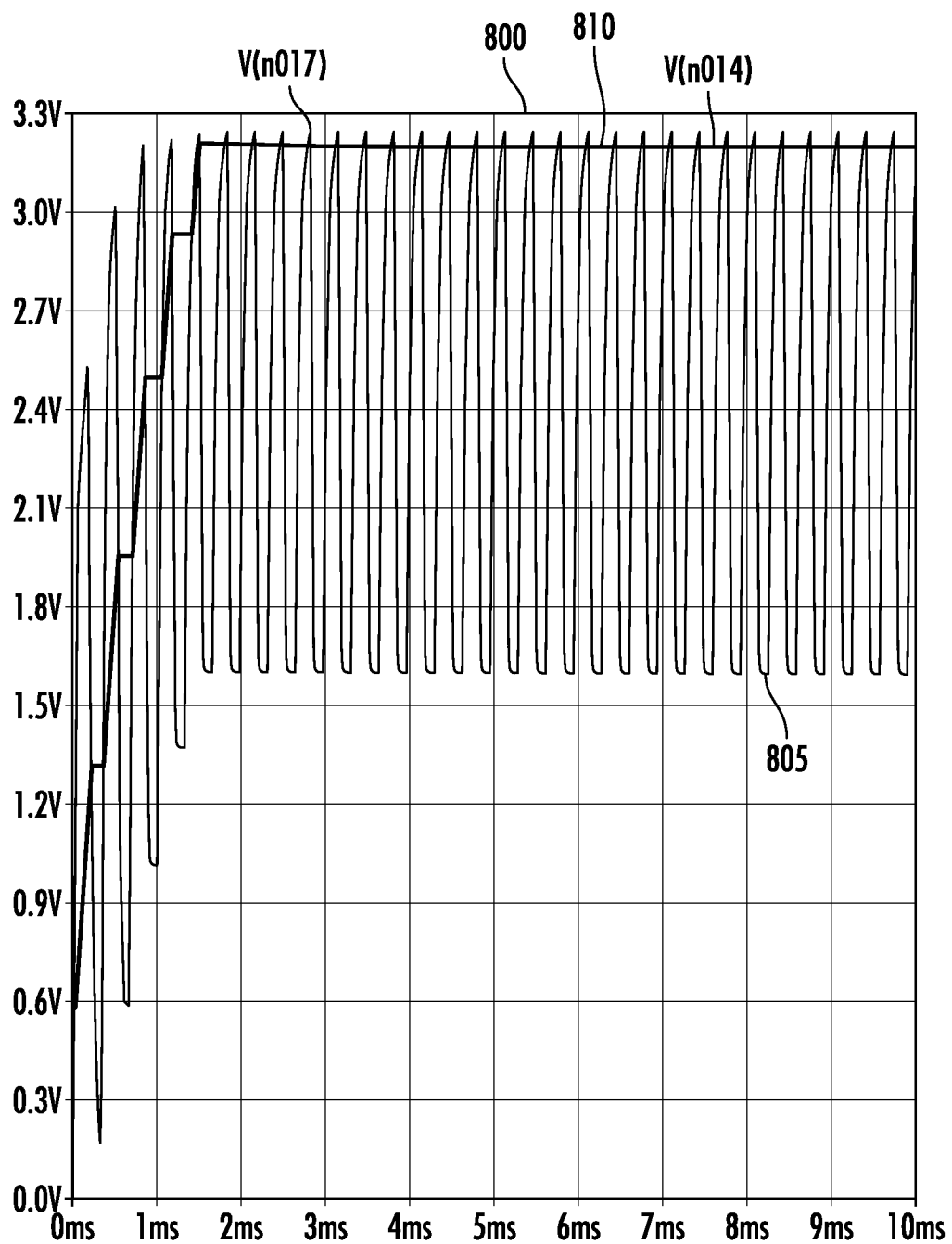
FIG. 8 provides a graph illustrating voltage measurements for the exemplary peak detection circuit of FIG. 7.

An exemplary graph 800 illustrating voltage measurements for exemplary peak detection circuit 700 is shown in FIG. 8. As shown in FIG. 8, output voltage signal 805 is an analog output signal with a sinusoidal output voltage. The peak detector circuit 700 receives output voltage signal 805 and, as described above in relation to FIG. 7, the peak detector circuit 700 can detect a maximum (and/or minimum) peak output voltage of the output voltage signal 805. For example, a current peak voltage detection value 810 is shown in FIG. 8. As the output voltage signal 805 is received over time, the peak detection circuit 700 can identify the current peak voltage detection value 810. After a set period of time, the current peak voltage detection value 810 can be output as a maximum detected voltage value to controller 325 for determining an identity of the motor 330.

The stored peak value can then be caused to identify a maximum voltage given a known input signal 333 and a known filter network 355, which allows motor control unit 325 to identify the type of motor 330.

In general, the type of motor 330 can be identified based on a filter characteristic of the filter network 355, such as the cutoff frequency of the filter network 355 and/or minimum and maximum output voltages of the filter network 355. For example, a specific manufacturer of motor 330 can have a specific resistance value of the electrical resistance component 340 assigned to the manufacturer by the manufacturer of the electrical appliance. As discussed above, varying the electrical resistance of the electrical resistance component 340 or varying the electrical capacitance of the electrical capacitance element 345 in the filter network 355 can change the cutoff frequency of the filter network 355 and/or the minimum and maximum voltage of the output signal 350 of the filter network 355. Therefore, each manufacturer of motors that can be used with the electrical appliance can have specific resistance and/or capacitance values and, therefore, have a unique cutoff frequency and/or minimum and maximum voltage values.

Motor control unit 325 can identify the cutoff frequency and/or minimum and maximum voltages based on the received output signal 350 from the motor assembly 327 and, in turn, identify the motor 330 of the motor assembly 327, such as identifying the motor 330 as a motor manufactured by Manufacturer A. To perform this identification, motor control unit 325 can use, for example, look-up tables, databases, or other similar data objects storing information about different types of motors that can be used in motor assemblies to operate the electrical appliance. Motor control unit 325 can compare the determined cutoff frequency and/or minimum and maximum voltage values of the output signal 350 to stored values in the data object to identify the motor 330.

Once motor 330 is identified, the motor control unit 325 can provide an identification of the motor 330 and operating parameters for the motor 330 (e.g., amplitude and frequency of control signal for a three-phase PWM for operating the motor, motor characteristics such as winding material and associated thermal characteristics, and the like) to machine controller 305 for operation of the motor 330. In some embodiments, motor control unit 325 can instead provide the cutoff frequency and/or the minimum and maximum voltage values to the machine controller 305. In these embodiments, machine controller 305 can perform the identification of the motor 330.

Figure 9:
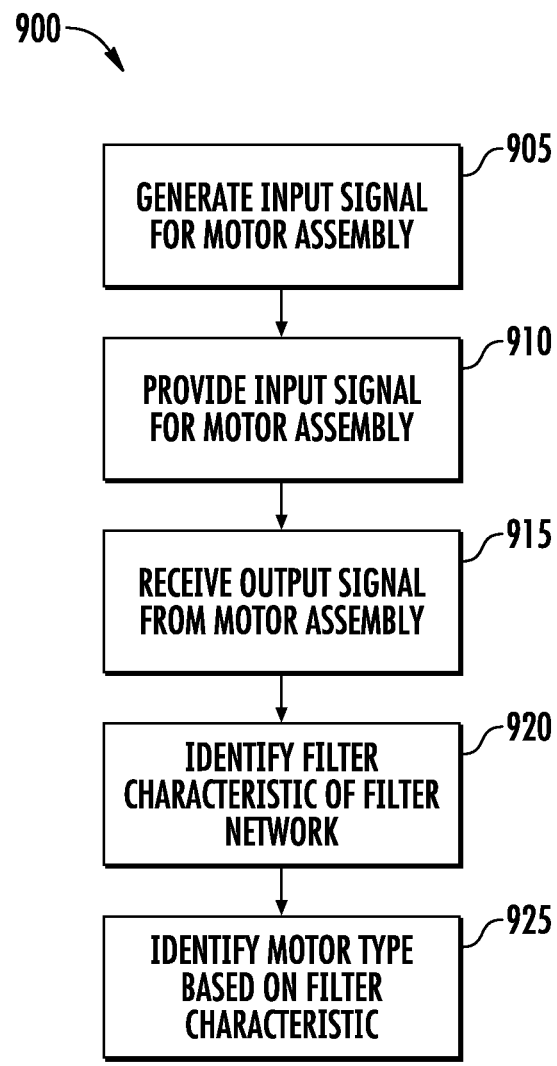
FIG. 9 provides a flow chart illustrating a method of identifying a type of electric motor coupled to an electrical appliance according to exemplary embodiments of the present disclosure.

FIG. 9 provides a flow chart illustrating a method 900 of identifying a type of electric motor coupled to an electrical appliance according to exemplary embodiments of the present disclosure. In some embodiments, the method 700 is stored as instructions in non-transitory, computer-readable medium and can be executed as a process by one or more processors, such as the motor control unit 325.

At block 905, the one or more processors generate an input signal 333 for a motor assembly 327. In some embodiments, the input signal 333 for the motor assembly 327 is a PWM signal with a fixed voltage (e.g., 3.3 volts). In some embodiments, the input signal 333 includes a plurality of input signals 333, each input being a PWM signal with a fixed voltage and having a frequency different than other input signal 333 of the plurality of input signals 333. For example, the plurality of input signals 333 can include signals sweeping a range of frequencies from 1 kHz to 6 kHz.

At block 910, the one or more processors provide the input signal(s) 333 to a motor assembly 327, such as to the motor assembly 327 described in FIG. 3A. For example, the one or more processors can provide the input signal(s) 333 to a connecting pin of the connector 335. If the one or more processors provide a plurality of input signals 333 to the motor assembly 327, the plurality of signals can be provided sequentially to the connecting pin of the connector 335.

At block 915, the one or more processors receive an output signal 350 from the motor assembly 327. For example, the one or more processors can receive an output signal 350 from a filter network 355 of the motor assembly 327 via a connecting pin of the connector 335. If the one or more processors provide a plurality of input signals 333 to the motor assembly 327, a plurality of output signals 350 can be received by the one or more processors, each output signal 350 corresponding to a single input signal 333.

At block 920, the one or more processors identify a filter characteristic of the filter network 355 of the motor assembly 327. For example, based on voltages of a series of received output signal 350, the one or more processors can calculate the gain of the filter network 355 and a point at which the input signal 333 have a frequency above the cutoff frequency of the filter network 355, such as when the gain is below a particular value or when a running series of calculated gain values indicates that the cutoff frequency has been reached.

In an alternative embodiment, instead of identifying a cutoff frequency of the filter network 355, the one or more processors can determine a minimum and maximum output voltage from the output signal 350 by, for example, applying an input signal at a fixed frequency and measuring the minimum and maximum output voltages from the filter network 355 using a peak detector circuit, such as peak detector circuit 700.

At block 925, the one or more processors identify a type of the motor based on the filter characteristic (e.g., the cutoff frequency or the minimum and maximum output voltage) of the filter network 355. For example, if the identified cutoff frequency is 3.1 kHz (or the minimum output voltage and the maximum output voltage are 2.5 V and 1 V, respectively), the one or more processors can use a database, look-up table, or other data object that stores information related to the cutoff frequency (or the minimum and maximum output voltage) to identify what type of motor is currently attached to the electrical appliance, such as a motor that is manufactured by a particular manufacturer or a motor having particular characteristics (aluminum or copper winding, allowable voltage levels, and the like). These characteristics and manufacturer details can be, in some embodiments, stored in the data objects along with the motor type and cutoff frequency (or minimum and maximum output voltage).

Based on the identification of the motor, the one or more processors can generate controls for the motor, such as generating three-phase PWM voltage inputs to operate the motor, limit the amount of current passing through the motor based on identified types of windings associated with the motor, and the like.

As explained above, aspects of the present subject matter are generally directed to systems and methods for detecting a type of motor installed in an electrical appliance, such as a dishwasher, from among multiple motors that may be potentially used in the electrical appliance. The identification of different types of motors or motor assemblies (such as a pump in a dishwasher) enables the appliance to sort multiple control parameters that may be used for each motor or motor assembly. Aspects of the present subject matter include a filter network comprising an electrical resistance element, such as a resistor, and an electrical capacitance element, such as a capacitor. Resistance values of the electrical resistance element and/or capacitance values of the electrical capacitance element are manufacturer or supplier dependent (e.g., are unique to a manufacturer or supplier). Based on the identity of the motor, a controller of the electrical appliance can select proper control parameters for the motor. To identify the motor, a controller can generate a PWM signal and read a filtered analog output signal from the filter network of the motor assembly. Based on the read output signal, the controller can identify a cutoff frequency of the filter network, a minimum voltage and maximum voltage of the filter network, and/or the gain of the filter network. To identify a cutoff frequency or a gain of the filter network, the controller can generate a set of input signals that "sweep" frequencies between a minimum and maximum frequency, and a resulting gain between the output signal and the input signal can be calculated. Based on the calculated gain, the controller can identify the cutoff frequency, and then identify the motor based on the cutoff frequency. To identify minimum and maximum voltages of the filter network, the controller can generate and provide an input signal at a fixed frequency and measure the resulting minimum and maximum output voltages using a peak detector circuit. Using the boundaries of the minimum and maximum output voltages, the controller can identify the motor. The present disclosure can be implemented to various types of motors in use in different kinds of electrical appliances. Active filters or passive filters can also be used in the filter network.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. An electrical appliance, the electrical appliance comprising:
    a motor assembly comprising at least one electric motor;
    a filter network, the filter network comprising an electrical resistance component and an electrical capacitance component, wherein at least one of the electrical resistance component or the electrical capacitance component is located within the motor assembly; and
    a controller electrically coupled to the motor assembly and the filter network, the controller comprising
        one or more processors; and
        a memory comprising instructions that, when executed by the one or more processors, cause the one or more processors to perform a process, the process comprising:
            providing an input signal to the filter network;
            receiving an output signal from the filter network, the output signal being filtered by the filter network;
            identifying a filter characteristic of the filter network based on the output signal; and
            identifying a type of the electric motor based on the identified filter characteristic.

2. The electrical appliance of claim 1, wherein at least one of the electrical resistance component or the electrical capacitance component of the filter network is located at the electrical appliance.

3. The electrical appliance of claim 1, wherein the electrical resistance component comprises a resistor having an electrical resistance unique to the type of the electric motor.

4. The electrical appliance of claim 1, wherein the electrical capacitance component comprises a capacitor having an electrical capacitance unique to the type of the electric motor.

5. The electrical appliance of claim 1, wherein the input signal is a pulse width modulated waveform with a fixed voltage.

6. The electrical appliance of claim 5, wherein the input signal comprises a plurality of signals, the plurality of signals including at least two signals with different frequencies.

7. The electrical appliance of claim 6, wherein the filter characteristic is a cutoff frequency, and wherein identifying the cutoff frequency of the filter network based on the output signal includes:
    determining an output voltage from the output signal for each signal of the plurality of signals;
    calculating a gain of the output signal based on the input signal and the determined output voltage for each signal of the plurality of signals; and
    identifying the cutoff frequency based on the calculated gain.

8. The electrical appliance of claim 1, wherein the filter network is a filter selected from the group consisting of a passive filter or an active filter.

9. The electrical appliance of claim 1, wherein the filter network is a filter selected from the group consisting of a low-pass filter, a high-pass filter, and a bandpass filter.

10. The electrical appliance of claim 1, wherein the input signal includes a fixed frequency.

11. The electrical appliance of claim 1, the electrical appliance further comprising a peak detector circuit, wherein the filter characteristic is a minimum output voltage and a maximum output voltage of the filter network, and wherein determining the minimum output voltage and a maximum output voltage of the filter network includes determining the minimum output voltage and a maximum output voltage of the filter network using the peak detector circuit.

12. A method for identifying a type of electric motor coupled to an electrical appliance, the method comprising:
    providing, by a controller, an input signal to a filter network of the electrical appliance;
    receiving, by the controller, an output signal from the filter network, the output signal being filtered by the filter network;
    identifying, by the controller, a filter characteristic of the filter network based on the output signal; and
    identifying, by the controller, a type of the electric motor based on the identified filter characteristic.

13. The method of claim 12, wherein the input signal is a pulse modulated waveform with a fixed voltage, and wherein the input signal comprises a plurality of signals, the plurality of signals including at least two signals with different frequencies.

14. The method of claim 12, wherein identifying the filter characteristic of the filter network based on the output signal includes:
    determining, by the controller, an output voltage from the output signal for each signal of the plurality of signals;
    calculating, by the controller, a gain of the output signal based on the input signal and the determined output voltage for each signal of the plurality of signals; and
    identifying, by the controller, the cutoff frequency based on the calculated gain.

15. The method of claim 12, wherein the filter characteristic is a minimum output voltage and a maximum output voltage of the filter network, and wherein determining the minimum output voltage and a maximum output voltage of the filter network includes determining the minimum output voltage and a maximum output voltage of the filter network using a peak detector circuit.

16. The method of claim 12, wherein the filter network is a filter selected from the group consisting of a low-pass filter, a high-pass filter, and a bandpass filter.

17. A non-transitory, computer-readable medium comprising instructions that, when executed by one or more processors, cause the one or more processes to perform a process, the process comprising:

providing an input signal to a filter network of the electrical appliance;

receiving an output signal from the filter network, the output signal being filtered by the filter network;

identifying a filter characteristic of the filter network based on the output signal; and identifying a type of the electric motor based on the identified filter characteristic.

18. The non-transitory, computer readable medium of claim 17, wherein the filter characteristic is a cutoff frequency, and wherein identifying the cutoff frequency of the filter network based on the output signal includes:

determining an output voltage from the output signal for each signal of the plurality of signals;

calculating a gain of the output signal based on the input signal and the determined output voltage for each signal of the plurality of signals; and identifying the cutoff frequency based on the calculated gain.

19. The non-transitory, computer-readable medium of claim 17, wherein the filter characteristic is a minimum output voltage and a maximum output voltage of the filter network, and wherein determining the minimum output voltage and a maximum output voltage of the filter network includes determining the minimum output voltage and a maximum output voltage of the filter network using a peak detector circuit.

20. The non-transitory, computer-readable medium of claim 17, wherein the filter network is a filter selected from the group consisting of a low-pass filter, a high-pass filter, and a bandpass filter.

\* \* \* \* \*